(12) United States Patent
Juds et al.

(10) Patent No.: US 10,191,089 B2
(45) Date of Patent: *Jan. 29, 2019

(54) CURRENT SENSING ASSEMBLY EMPLOYING MAGNETIC SENSORS

(71) Applicant: EATON CORPORATION, Cleveland, OH (US)

(72) Inventors: Mark Allan Juds, New Berlin, WI (US); Jerome Kenneth Hastings, Sussex, WI (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 0 days.

This patent is subject to a terminal disclaimer.

(21) Appl. No.: 15/797,122

(22) Filed: Oct. 30, 2017

(65) Prior Publication Data

US 2018/0045763 A1 Feb. 15, 2018

Related U.S. Application Data

(62) Division of application No. 14/102,675, filed on Dec. 11, 2013, now Pat. No. 9,846,180.

(51) Int. Cl.
*G01R 31/06* (2006.01)
*G01R 15/20* (2006.01)
(Continued)

(52) U.S. Cl.
CPC ......... *G01R 15/207* (2013.01); *G01R 15/202* (2013.01); *H01H 33/027* (2013.01); *H01H 71/125* (2013.01)

(58) Field of Classification Search
CPC .... G01R 15/202; G01R 15/14; G01R 15/207; G01R 33/07; G01R 13/0254;
(Continued)

(56) References Cited

U.S. PATENT DOCUMENTS 5,041,780 A 8/1991 Rippel
6,130,599 A 10/2000 Juds et al.
(Continued)

FOREIGN PATENT DOCUMENTS

EP 1 037 241 A2 9/2000
EP 1 074 847 A1 2/2001
(Continued)

OTHER PUBLICATIONS

European Patent Office, "International Search Report and Written Opinion", dated Jan. 19, 2015, 14 pp.

*Primary Examiner* — Vinh Nguyen
(74) *Attorney, Agent, or Firm* — Eckert Seamans

(57) ABSTRACT

A current sensing assembly includes a conductor having a first side, a second side opposite the first side, a third side, and a fourth side opposite the third side. The first side has a first notch formed therein and the second side has a second notch formed therein opposite the first notch. The current sensing assembly also includes a sensor assembly including a first magnetic sensor disposed in the first notch or proximate to the third side of the conductor between the first and second notches, and a second magnetic sensor disposed in the second notch or proximate to the fourth side of the conductor between the first and second notches.

8 Claims, 7 Drawing Sheets

(51) Int. Cl.
*H01H 33/02* (2006.01)
*H01H 71/12* (2006.01)

(58) Field of Classification Search
CPC .... G01R 15/183; G01R 15/186; G01R 15/20;
G01R 15/205; G01R 19/145; G01R
19/2513; G01R 19/2516; G01R 1/06788;
G01R 21/08; G01R 29/0892; G01R
31/025; G01R 31/2884; G01R 31/34;
G01R 31/343; G01R 31/3606; G01R
31/3624; G01R 31/3658; G01R 31/42;
G01R 33/0023; G01R 33/0035; G01R
33/0052; G01R 33/02; G01R 33/0206;
G01R 33/022; G01R 33/035; G01R
33/04; G01R 33/075; G01R 33/09; G01R
33/285; G01R 35/002; G01R 29/0878;
H01L 43/065; H01L 43/08; H01L 43/14;
H01L 43/06; H01H 33/027; H01H 71/125
See application file for complete search history.

(56) References Cited

U.S. PATENT DOCUMENTS

| | | | |
|---|---|---|---|
| 6,271,656 B1 | 8/2001 | Juds et al. | |
| 7,157,898 B2 | 1/2007 | Hastings et al. | |
| 7,298,133 B2 | 11/2007 | Hastings | |
| 9,134,351 B2 * | 9/2015 | Juds | G01R 19/0084 |
| 2005/0073293 A1 | 4/2005 | Hastings et al. | |
| 2011/0234215 A1 | 9/2011 | Ausserlechner | |
| 2012/0086444 A1 * | 4/2012 | Chen | G01R 33/0029 324/251 |

FOREIGN PATENT DOCUMENTS

| | | |
|---|---|---|
| EP | 2 295 993 A1 | 3/2011 |
| EP | 2 667 397 A2 | 11/2013 |

* cited by examiner

CURRENT SENSING ASSEMBLY EMPLOYING MAGNETIC SENSORS

CROSS-REFERENCE TO RELATED APPLICATIONS

This application is a divisional of, and claims priority under 35 U.S.C. § 120 from, U.S. patent application Ser. No. 14/102,675, filed Dec. 11, 2013, now U.S. Pat. No. 9,846,180, entitled "CURRENT SENSING ASSEMBLY EMPLOYING MAGNETIC SENSORS", the contents of which are incorporated herein by reference.

This application is also related to commonly assigned U.S. patent application Ser. No. 14/102,660, filed Dec. 11, 2013, now U.S. Pat. No. 9,134,351, entitled "BI-DIRECTIONAL CURRENT SENSING CIRCUIT AND CURRENT SENSING ASSEMBLY INCLUDING THE SAME", which issued as U.S. Pat. No. 9,134,351, on Sep. 15, 2015.

BACKGROUND

Field

The disclosed concept relates generally to current sensing and, more particularly, to assemblies for sensing current flowing through a conductor using magnetic sensors.

Background Information

Current sensing assemblies have been employed in electrical switching apparatus, such as circuit interrupters, to measure the current flowing there through. These current sensing assemblies generally require high accuracy in order to accurately sense the current for a number of trip functions. Current sensing assemblies with a wide current range are also preferable due to the dynamic operating range of circuit interrupters.

Direct current circuit breakers, for example, have used resistive shunts to sense direct current flowing through the circuit breaker. However, the resistive shunts cause a voltage drop in the circuit breaker. Additionally, resistive shunts heat up when current is flowing through them. Both the voltage drop and the heating caused by resistive shunts are undesirable in circuit breakers.

Magnetic sensors have also been used to measure current in circuit breakers. In order to obtain a high accuracy and a wide current range from magnetic sensors, relatively complex configurations of the magnetic sensors have been used in conjunction with relatively large flux concentrators. These types of sensor assemblies are relatively large and expensive. Furthermore, the magnetic material used in flux concentrators exhibits a saturating and non-linear relationship between the magnetic force and the flux density. Typical magnetic sensors are also susceptible to external fields, and thus, are at risk of providing inaccurate results.

There is room for improvement in current sensing assemblies.

There is also room for improvement in electrical switching apparatus including current sensing assemblies.

SUMMARY

These needs and others are met by aspects of the disclosed concept which provide a current sensing assembly including a conductor having notches formed therein and magnetic sensors disposed in or between the notches. These needs and others are also met by aspects of the disclosed concept which provide a current sensing assembly including a conductor having curled portions and magnetic sensors disposed in the curled portions. These needs and others are also met by aspects of the disclosed concept which provide an electrical switching apparatus including a current sensing assembly including a conductor having notches formed therein and magnetic sensors disposed in or between the notches.

In accordance with aspects of the disclosed concept, a current sensing assembly comprises: a conductor having a first side, a second side opposite the first side, a third side, and a fourth side opposite the third side, the first side having a first notch formed therein and the second side having a second notch formed therein opposite the first notch; and a sensor assembly including a first magnetic sensor disposed in the first notch or proximate to the third side of the conductor between the first and second notches, and a second magnetic sensor disposed in the second notch or proximate to the fourth side of the conductor between the first and second notches.

In accordance with other aspects of the disclosed concept, a current sensing assembly comprises: a conductor having a first curled portion and a second curled portion, the first curled portion being arranged such that current flowing in a first direction through the conductor flows through the first curled portion in a clockwise direction and the second curled portion being arranged such that current flowing in the first direction through the conductor flows through the second curled portion in a counter-clockwise direction; and a sensor assembly including a first magnetic sensor disposed in the first curled portion and a second magnetic sensor disposed in the second curled portion.

In accordance with other aspects of the disclosed concept, an electrical switching apparatus comprises: a number of first conductors; and a number of current sensing assemblies. Each of the current sensing assemblies includes a second conductor having a first side, a second side opposite the first side, a third side, and a fourth side opposite the third side, the first side having a first notch formed therein and the second side having a second notch formed therein opposite the first notch; and a sensor assembly including a first magnetic sensor disposed in the first notch or proximate to the third side of the conductor between the first and second notches, and a second magnetic sensor disposed in the second notch or proximate to the fourth side of the conductor between the first and second notches.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

Figure 1A:
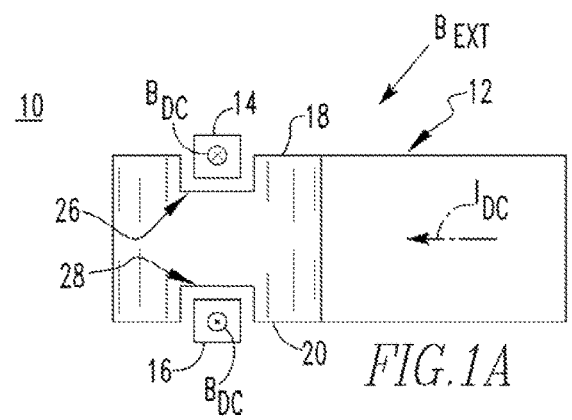
FIG. 1A is a top plan view of a current sensing assembly including a conductor having notches in accordance with an example embodiment of the disclosed concept.

Directional phrases used herein, such as, for example, left, right, front, back, top, bottom and derivatives thereof, relate to the orientation of the elements shown in the drawings and are not limiting upon the claims unless expressly recited therein.

As employed herein, the statement that two or more parts are "coupled" together shall mean that the parts are joined together either directly or joined through one or more intermediate parts.

As employed herein, the term "number" shall mean one or an integer greater than one (i.e., a plurality).

As employed herein, the term "magnetic sensor" shall mean a sensor capable of measuring the amplitude of a magnetic field. One non-limiting example of a magnetic sensor is a Hall sensor.

As employed herein, the term "notch" shall mean a shaped cut in an object.

As employed herein, the term "curled" shall mean bent into an arc form having one or more radii. The arc form of a curled portion is not limited to less than 360 degrees, but rather may extend beyond 360 degrees and form multiple turns.

As employed herein, the term "horizontally aligned" shall mean disposed in the same horizontal plane.

As employed herein, the term "vertically aligned" shall mean disposed in the same vertical plane.

Figure 1B:
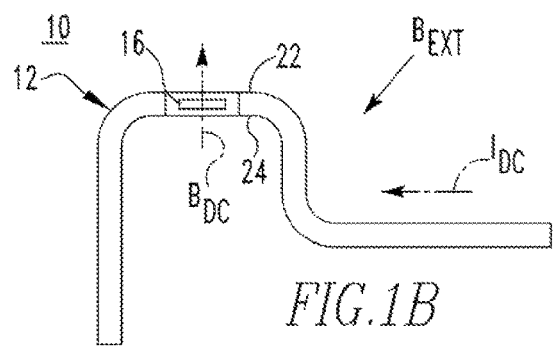
FIG. 1B is a vertical elevation view of the current sensing assembly of FIG. 1A.

Referring to FIGS. 1A and 1B, a current sensing assembly 10 includes a conductor 12 and a sensor assembly including first and second magnetic sensors 14,16. The conductor 12 has a first side 18 and a second side 20 opposite the first side. The conductor also has a third side 22 and a fourth side 24 opposite the third side. A first notch 26 is formed in the first side 18 of the conductor 12 and a second notch 28 is formed in the second side 20 of the conductor 12 opposite the first notch 26.

The first and second magnetic sensors 14,16 are disposed in the first and second notches 26,28, respectively. The first and second magnetic sensors 14,16 are oriented such that when a current $I_{DC}$ flows through the conductor 12, a magnetic field $B_{DC}$ induced by the current $I_{DC}$ passes through the first and second magnetic sensors 14,16 in opposite directions. As shown in FIGS. 1A and 1B, the magnetic field $B_{DC}$ induced by the current $I_{DC}$ flowing through the conductor 12 passes downward (i.e., into the paper in FIG. 1A) through the first magnetic sensor 14 and upward (i.e., out of the paper in FIG. 1A) through the second magnetic sensor 16.

External magnetic fields $B_{EXT}$ are magnetic fields caused by sources other than the current $I_{DC}$ flowing through the conductor 12. To effectively cancel the external magnetic fields $B_{EXT}$ from the readings of the first and second magnetic sensors 14,16, the outputs of the first and second magnetic sensors 14,16 are subtracted from each other. The sensor assembly still has a small sensitivity to external magnetic fields $B_{EXT}$ due to the horizontal distance between first and second magnetic sensors 14,16. However, placing the first and second magnetic sensors 14,16 in the first and second notches 26,28 reduces the distance between them compared to placing them proximate to the first and second sides 18,20 of the conductor in an area where the first and second notches 26,28 are not located.

In addition to providing a location that allows the first and second magnetic sensors 14,16 to be located closer together, the first and second notches 26,28 also concentrate the current $I_{DC}$ flowing through the conductor in a smaller portion of the conductor. This concentration leads to the magnetic field $B_{DC}$ passing through the first and second magnetic sensors 14,16 to be larger than would occur if the first and second notches 26,28 were not present. Additionally, the current $I_{DC}$ flowing through the conductor 12 crowds the corners of the first and second notches (i.e., the current $I_{DC}$ preferentially takes the shortest path through the conductor 12), which also results in the magnetic field $B_{DC}$ passing through the first and second magnetic sensors 14,16 to be larger than would occur if the first and second notches 26,28 were not present.

It is contemplated that the first and second magnetic sensors 14,16 may be Hall sensors or any other suitable type of magnetic sensor. Magnetic sensors, such as Hall sensors, are generally smaller than current transformers and employing magnetic sensors in the current sensing assembly 10 allows the current sensing assembly 10 to have a smaller size and be more easily integrated into electrical devices compared with current sensing configurations that employ current transformers.

Figure 2A:
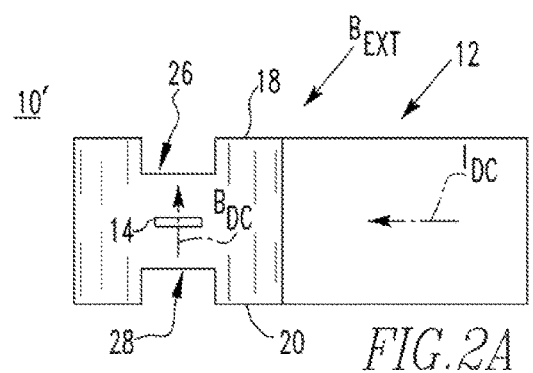
FIG. 2A is a top plan view of a current sensing assembly including a conductor having notches in accordance with another example embodiment of the disclosed concept.
Figure 2B:
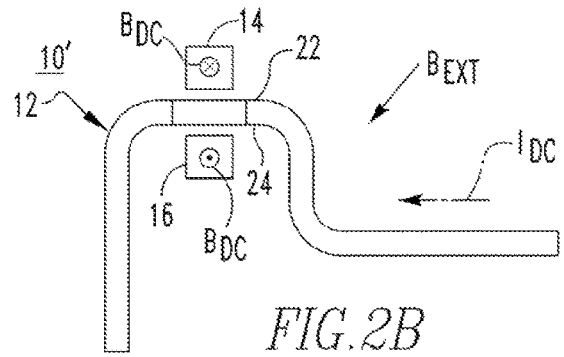
FIG. 2B is a vertical elevation view of the current sensing assembly of FIG. 2A.

Referring to FIGS. 2A and 2B, a current sensing assembly 10' in accordance with another example embodiment of the disclosed concept includes the first and second magnetic sensors 14,16, similar to the current sensing assembly 10 shown in FIGS. 1A and 1B. However, in the current sensing assembly 10', the first and second magnetic sensors 14,16 are respectively disposed proximate to the third and fourth sides 22,24 of the conductor 12 between the first and second notches 26,28.

In the current sensing assembly 10' of FIGS. 2A and 2B, the first and second magnetic sensors 14,16 are vertically aligned. When the first and second magnetic sensors 14,16 are vertically aligned, external magnetic fields $B_{EXT}$ caused by other conductors horizontally aligned with the conductor 12 can be fully canceled by the first and second magnetic sensors 14,16 since there is no horizontal spacing between the first and second magnetic sensors 14,16. Thus, the current sensing assembly 10' is particularly suitable in applications where conductors are horizontally aligned. In contrast with the current sensing assembly 10' of FIGS. 2A and 2B, the current sensing assembly 10 of FIGS. 1A and 1B includes first and second magnetic sensors 14,16 that are horizontally aligned. Thus, in the current sensing assembly 10, external magnetic fields $B_{EXT}$ that vary in the vertical direction can be fully canceled.

Figure 3A:
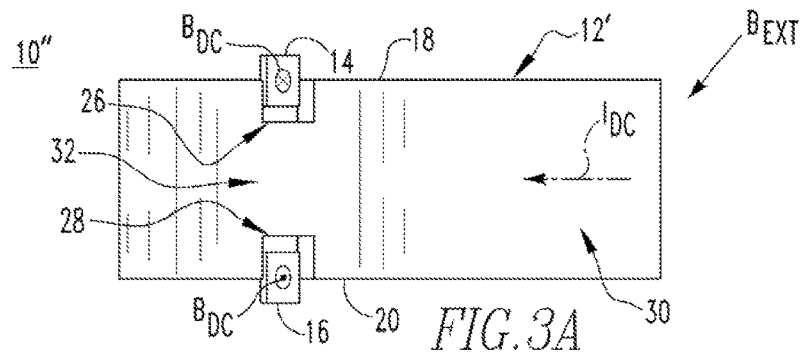
FIG. 3A is a top plan view of a current sensing assembly including a conductor having notches with magnetic sensors disposed in the notches in accordance with another example embodiment of the disclosed concept.
Figure 3B:
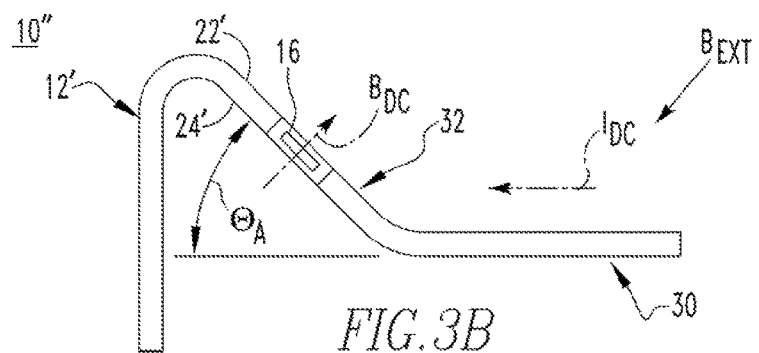
FIG. 3B is a vertical elevation view of the current sensing assembly of FIG. 3A.

Referring now to FIGS. 3A and 3B, a current sensing assembly 10" in accordance with another example embodiment of the disclosed concept includes a conductor 12' and a sensor assembly including first and second magnetic sensors 14,16. The conductor 12' has a first side 18 and a second side 20 opposite the first side. The conductor also has a third side 22' and a fourth side 24' opposite the third side. A first notch 26 is formed in the first side 18 of the conductor 12' and a second notch 28 is formed in the second side 20 of the conductor 12' opposite the first notch 26.

The conductor 12' includes a horizontal portion 30 and an angled portion 32 that is disposed at an angle $\theta_A$ with respect to the horizontal portion 30. The first and second notches 26,28 are formed in the angled portion 32 of the conductor 12'. The first and second magnetic sensors 14,16 are respectively disposed in the first and second notches 26,28. The first and second notches 14,16 are also oriented at the same angle $\theta_A$ with respect to the horizontal portion 30 of the conductor 12' as the angled portion 32 of the conductor 12'. The horizontal distance between the first and second magnetic sensors 14,16 prevents external magnetic fields $B_{EXT}$ caused by current flowing through other horizontally oriented conductors from being completely canceled. However, the error caused by such external magnetic fields $B_{EXT}$ is reduced by orienting the first and second magnetic sensors 14,16 at an angle with respect to other horizontally oriented conductors.

Figure 4A:
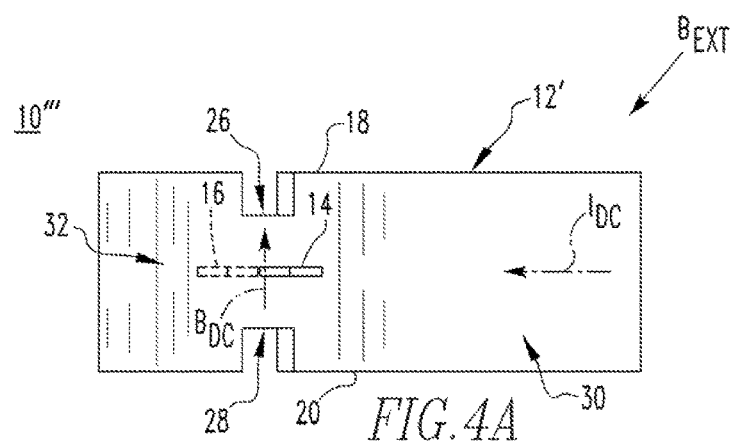
FIG. 4A is a top plan view of a current sensing assembly including a conductor having notches with magnetic sensors disposed proximate to the conductor between the notches in accordance with another example embodiment of the disclosed concept.
Figure 4B:
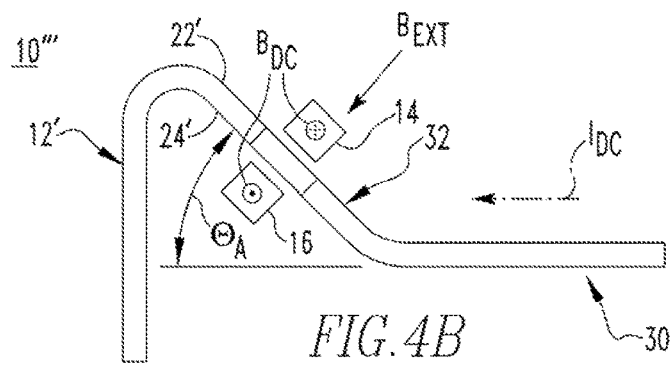
FIG. 4B is a vertical elevation view of the current sensing assembly of FIG. 4A.

Referring to FIGS. 4A and 4B, a current sensing assembly 10''' in accordance with another example embodiment of the disclosed concept includes the conductor 12' and the first and second magnetic sensors 14,16, similar to the current sensing assembly 10" shown in FIGS. 3A and 3B. However, in the current sensing assembly 10''', the first and second magnetic sensors 14,16 are respectively disposed proximate to the third and fourth sides 22',24' of the conductor 12' between the first and second notches 26,28.

Figure 5:
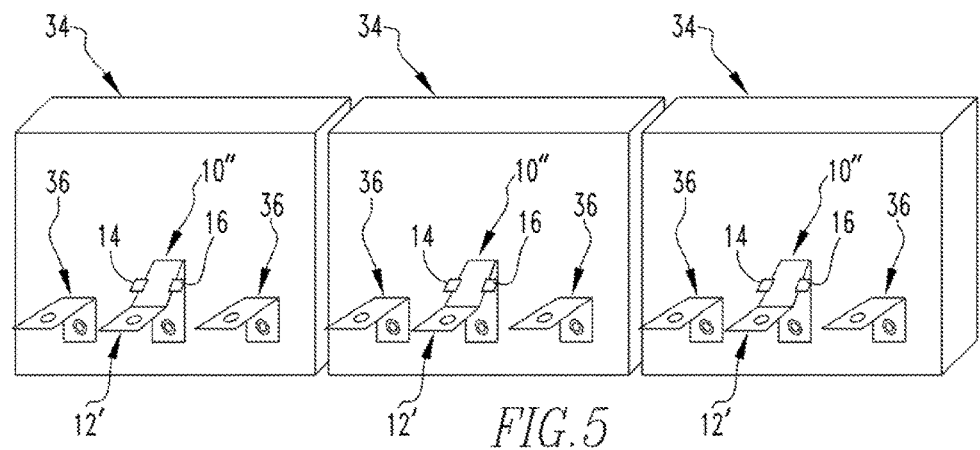
FIG. 5 is an isometric view of the current sensing assembly of FIG. 3A installed on an electrical switching apparatus.

Referring to FIG. 5, three example electrical switching apparatus 34 (e.g., without limitation, circuit breakers) each include the current sensing assembly 10" of FIGS. 3A and 3B. The electrical switching apparatus 34 also include horizontally oriented conductors 36 located adjacent to the current sensing assemblies 10". The horizontally oriented conductors 36 and the conductor 12' of the current sensing assembly 10" each correspond to one of the poles of the electrical switching apparatus 34. While a three pole electrical switching apparatus 34 including two horizontally oriented conductors 36 and one current sensing assembly 10" is shown, it will be appreciated by those having ordinary skill in the art that the disclosed concept may be adapted for use with electrical switching apparatus having any number of poles without departing from the scope of the disclosed concept.

The first and second magnetic sensors 14,16 are oriented at an angle with respect to the horizontally oriented conductors 36, thus reducing the effect of magnetic fields caused by current flowing through the horizontally oriented conductors 36. It will also be appreciated that any of the current sensing assemblies described herein may also be employed in the electrical switching apparatus 34 without departing from the scope of the disclosed concept. It will also be appreciated that the current sensing assembly 10' shown in FIGS. 2A and 2B is particularly suitable for use with the electrical switching apparatus 34 since the vertically aligned first and second magnetic sensors 14,16 can completely cancel magnetic fields caused by the horizontally oriented conductors 36.

Figure 6:
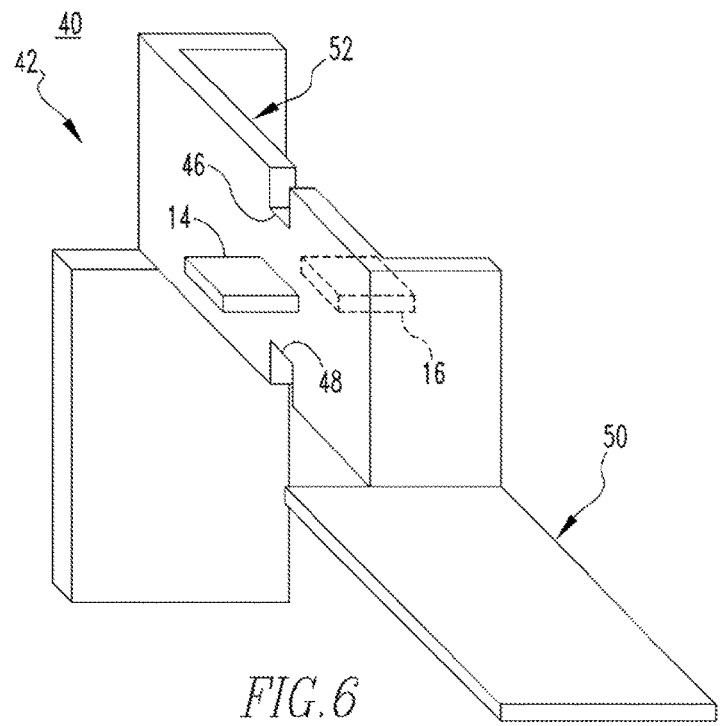
FIG. 6 is an isometric view of a current sensing assembly including a conductor having notches in accordance with another example embodiment of the disclosed concept.

FIG. 6 shows a current sensing assembly 40 having a conductor 42 which includes a horizontally oriented portion 50 and a vertically oriented portion 52. First and second notches 46,48 are formed in the vertically oriented portion 52 of the conductor 42. In contrast with the current sensing assembly 10 shown in FIGS. 1A and 1B where the first and second notches 26,28 are horizontally aligned, the first and second notches 46,48 in the current sensing assembly 40 are vertically aligned. The current sensing assembly 40 further includes a sensor assembly including first and second magnetic sensors 14,16 disposed proximate to opposite sides of the conductor between the first and second notches 14,16. It will also be appreciated by those having ordinary skill in the art that the first and second magnetic sensors 14,16 may be respectively disposed in the first and second notches 46,48 without departing from the scope of the disclosed concept.

Figure 7A:
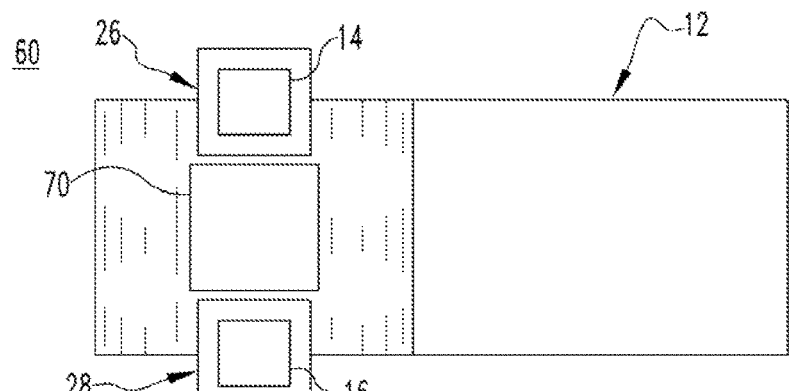
FIG. 7A is a top plan view of a current sensing assembly including a flux concentrator in accordance with an example embodiment of the disclosed concept.
Figure 7B:
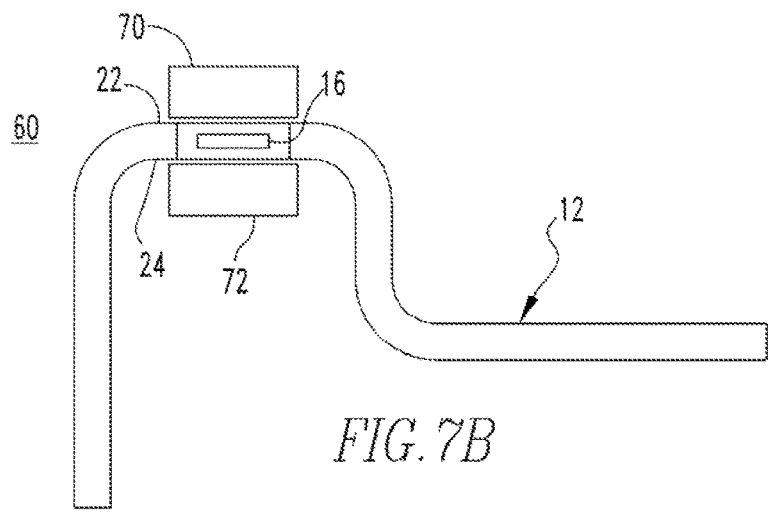
FIG. 7B is a vertical elevation view of the current sensing assembly of FIG. 7A.

Referring to FIGS. 7A and 7B, a current sensing assembly 60 includes the same conductor 12 and sensor assembly including first and second magnetic sensors 14,16 as the current sensing assembly 10 of FIGS. 1A and 1B. However, the current sensing assembly 60 further includes first and second flux concentrators 70,72 respectively disposed on the third and fourth sides 22,24 of the conductor proximate to the first and second notches 26,28.

The first and second flux concentrators 70,72 may be made of soft magnetic materials (e.g., without limitation, iron; nickel; steel). The first and second flux concentrators 70,72 increase the magnetic field on the first and second magnetic sensors 14,16. However, the first and second flux concentrators 70,72 also reduce the range of the linear relationship of the current flowing through the conductor 12 and the magnetic field on the first and second magnetic sensors 14,16 due to hysteresis and saturation effects.

While the current sensing assembly 60 includes both the first and second flux concentrators 70,72, it will be appreciated by those having ordinary skill in the art that either one of the first and second flux concentrators 70,72 may be omitted without departing from the scope of the disclosed concept.

Figure 7C:
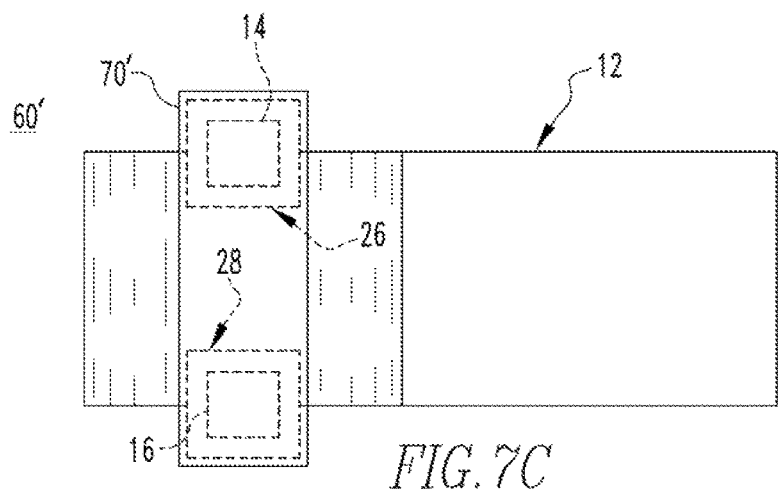
FIG. 7C is a top plan view of a current sensing assembly including a flux concentrator in accordance with another example embodiment of the disclosed concept.

In the current sensing assembly 60 shown in FIGS. 7A and 7B, the first and second flux concentrators 70,72 do not cover the first and second magnetic sensors 14,16. FIG. 7C shows another example current sensing assembly 60' similar to the current sensing assembly 60 of FIGS. 7A and 7B. However, the current sensing assembly 60' includes a first flux concentrator 70' that covers the first and second magnetic sensors 14,16. Although it is not shown in FIG. 7C, the current sensing assembly 60' may also include a second flux concentrator disposed on the opposite side of the conductor 12 as the first flux concentrator 70', and also covering the first and second magnetic sensors 14,16.

It is contemplated that flux concentrators may also be adapted for use in conjunction with any of the current sensing assemblies described herein without departing from the scope of the disclosed concept.

Figure 8:
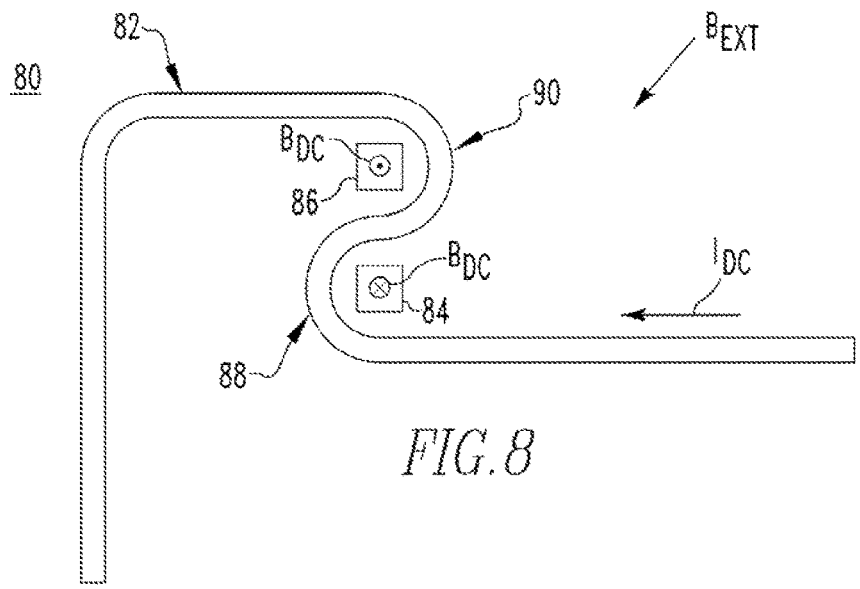
FIG. 8 is a vertical elevation view of a current sensing assembly including a conductor having curled portions in accordance with an example embodiment of the disclosed concept.

Referring now to FIG. 8, a current sensing assembly 80 in accordance with another example embodiment of the disclosed concept includes a conductor 82 having first and second curled portions 88,90. The first and second curled portions 88,90 are arranged such that a current $I_{DC}$ flowing in a direction through the conductor 82 flows through the first curled portion 88 in a clockwise direction and the second curled portion 90 in a counter-clockwise direction.

The current sensing assembly further includes first and second magnetic sensors 84,86. The first and second magnetic sensors 84,86 are respectively disposed in the first and second curled portions 88,90 of the conductor 82. The current $I_{DC}$ flowing through the conductor 82 causes a magnetic field $B_{DC}$ through the first and second magnetic sensors 84,86. The magnetic field $B_{DC}$ through the first magnetic sensor 84 is oriented opposite of the magnetic field $B_{DC}$ through the second magnetic sensor 86. The outputs of the first and second magnetic sensors 84,86 can be subtracted from each other in order to cancel the effects of external magnetic fields $B_{EXT}$. Additionally, the first and second curled portions 88,90 of the conductor 82 concentrate the magnetic field $B_{DC}$ through the first and second magnetic sensors 84,86.

The arc lengths of the first and second curled portions 88,90 of the conductor 82 are each about 180 degrees. However, the disclosed concept is not limited thereto, as will be described hereinafter.

Figure 9:
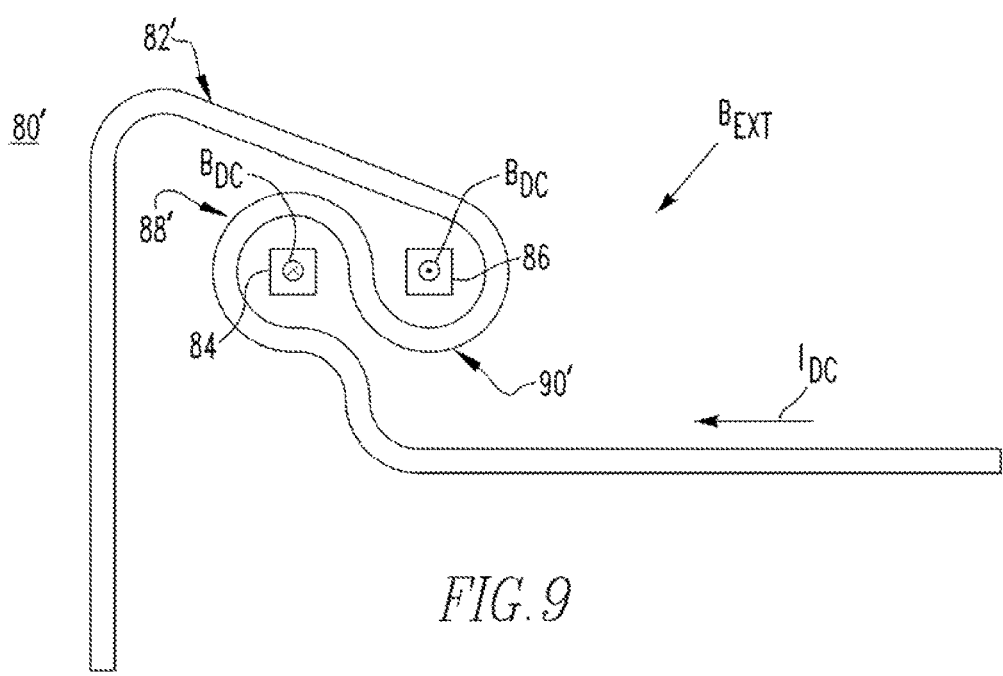
FIG. 9 is a vertical elevation view of a current sensing assembly including a conductor having curled portions in accordance with another example embodiment of the disclosed concept.

Referring to FIG. 9, a current sensing assembly 80' includes a conductor 82' having first and second curled portions 88',90' similar to the current sensing assembly 80 of FIG. 8. However, the first and second curled portions 88',90' each have an arc length between about 180 degrees and 360 degrees. Increasing the arc length of the first and second curled portions 88',90' above 180 degrees further increases the ability of the first and second curled portions 88',90' to concentrate the magnetic field $B_{DC}$ through the first and second magnetic sensors 84,86.

Figure 10:
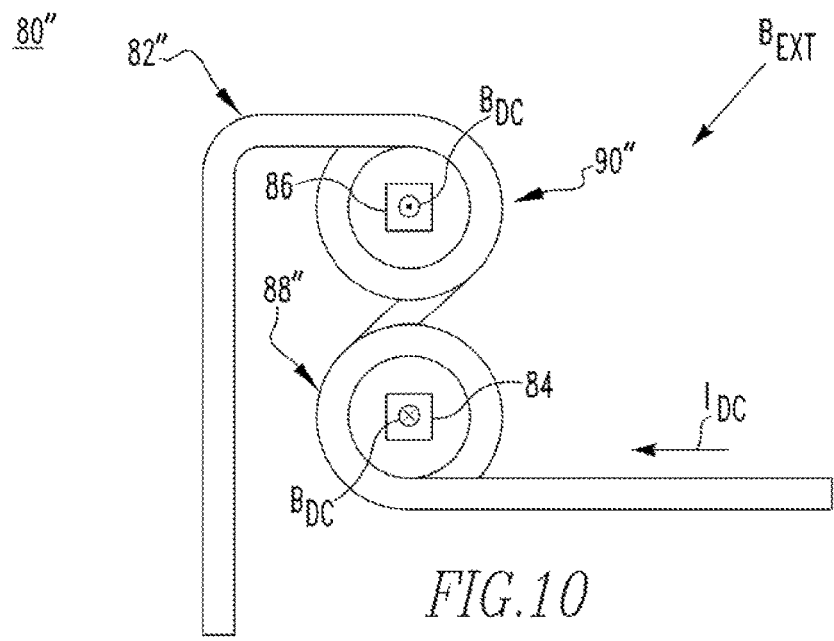
FIG. 10 is a vertical elevation view of a current sensing assembly including a conductor having coils in accordance with an example embodiment of the disclosed concept.

FIG. 10 shows a current sensing assembly 80" including a conductor 82" having first and second curled portions 88",90". The first and second curled portions 88",90" each include a plurality of turns. The first and second curled portions 88",90" are able to concentrate the magnetic field $B_{DC}$ through the first and second magnetic sensors 84,86 more than the first and second curled portions 88,90 of the current sensing assembly 80 of FIG. 8 or the first and second curled portions 88',90' of the current sensing assembly 80' of FIG. 9.

Figure 11:
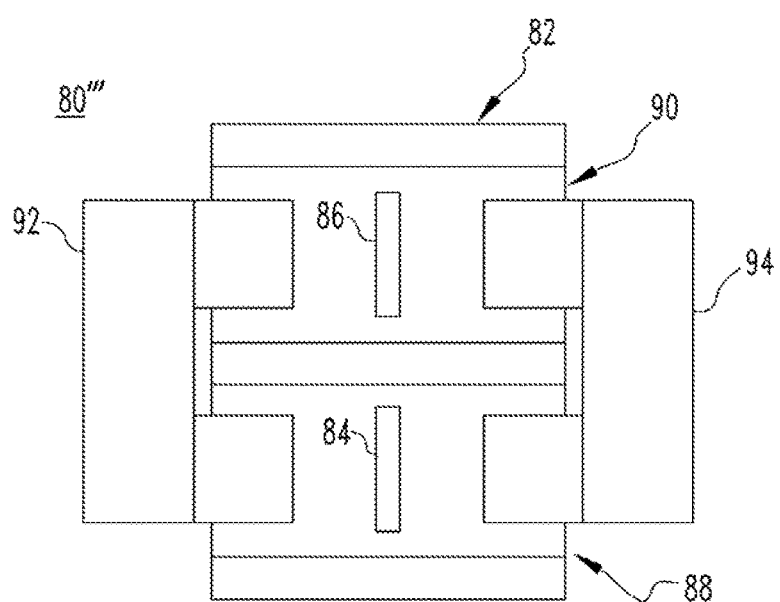
FIG. 11 is a cross-sectional view of a current sensing assembly including a flux concentrator and a conductor having coils in accordance with an example embodiment of the disclosed concept.

Referring to FIG. 11, a current sensing assembly 80''' is similar to the current sensing assembly 80 of FIG. 8 and includes the conductor 82 having first and second curled portions 88,90 and the first and second magnetic sensors 84,86 respectively disposed in the first and second curled portions 88,90. However, the current sensing assembly 80''' of FIG. 10 further includes a flux concentrator assembly including first and second flux concentrators 92,94 that are disposed on opposite sides of the first and second curled portions 88,90 of the conductor 82, respectively.

The first and second flux concentrators 92,94 may be made of soft magnetic materials (e.g., without limitation, iron; nickel; steel). The first and second flux concentrators 92,94 increase the magnetic field on the first and second magnetic sensors 84,86. However, the first and second flux concentrators 92,94 also reduce the range of the linear relationship of the current flowing through the conductor 82 and the magnetic field on the first and second magnetic sensors 84,86 due to hysteresis and saturation effects.

While the first and second flux concentrators 92,94 are disclosed with respect to the conductor 82 and sensor assembly of FIG. 8, it will be appreciated by those having ordinary skill in the art that similar flux concentrators may be adapted for use in conjunction with the current sensing assemblies of FIGS. 9 and 10 without departing from the scope of the disclosed concept.

Figure 12A:
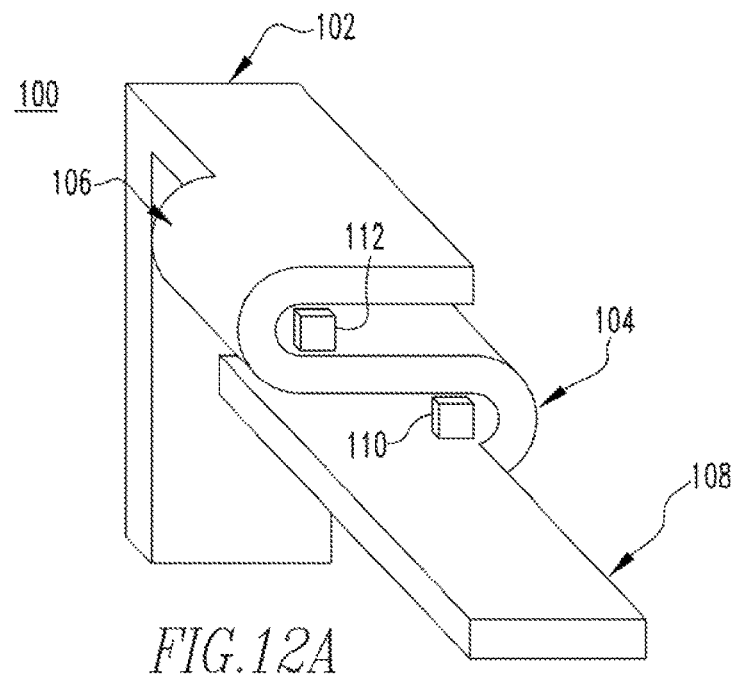
FIG. 12A is an isometric view of a current sensing assembly including a conductor having transverse curled portions in accordance with an example embodiment of the disclosed concept.

Referring now to FIG. 12A, a current sensing assembly 100 in accordance with another example embodiment of the disclosed concept includes a conductor 102 having first and second curled portions 104,106. The conductor 102 further includes a horizontal portion 108. The first and second curled portions 104,106 extend vertically from the horizontal portion 108 and are oriented transverse with respect to the horizontal portion 108.

The current sensing assembly 100 further includes a sensor assembly including first and second magnetic sensors 110,112. The first and second magnetic sensors 110,112 are respectively disposed approximately in the centers of the first and second curled portions 104,106.

Figure 12B:
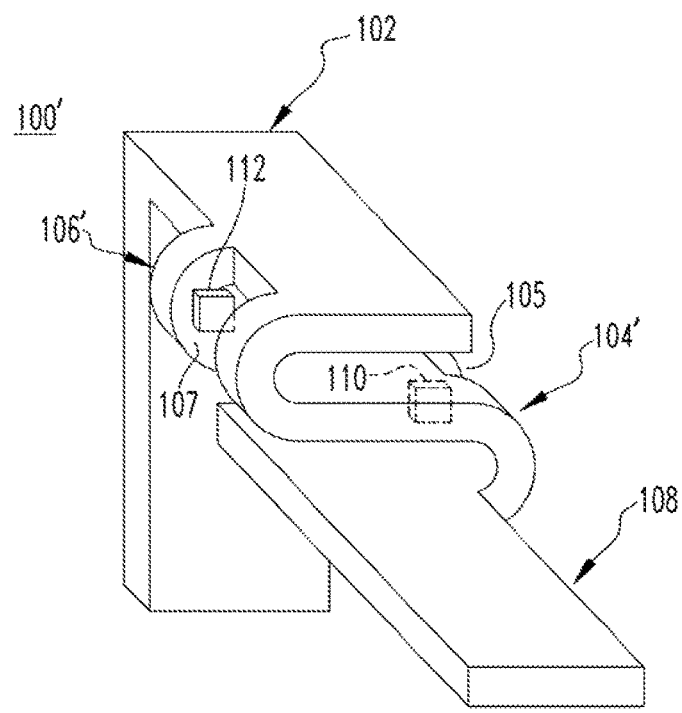
FIG. 12B is an isometric view of a current sensing assembly including a conductor having transverse curled portions with notches in accordance with an example embodiment of the disclosed concept.

In FIG. 12B, a current sensing assembly 100' includes first and second curled portions 104',106'. The conductor further includes a horizontal portion 108. The first and second curled portions 104',106' extend vertically from the horizontal portion 108 and are oriented transverse with respect to the horizontal portion 108. The first curled portion 104' has a first notch 105 formed therein and the second curled portion 106' has a second notch 107 formed therein.

The current sensing assembly 100' further includes a sensor assembly including first and second magnetic sensors 110,112. The first and second magnetic sensors 110,112 are respectively disposed in the first and second notches 105, 107.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:
1. A current sensing assembly comprising:
   a conductor having a first curled portion and a second curled portion, the first curled portion being arranged such that current flowing in a first direction through the conductor flows through the first curled portion in a clockwise direction and the second curled portion being arranged such that current flowing in the first direction through the conductor flows through the second curled portion in a counter-clockwise direction; and
   a sensor assembly including a first magnetic sensor disposed in the first curled portion and a second magnetic sensor disposed in the second curled portion.
2. The current sensing assembly of claim 1, wherein the first and second curled portions each have an arc length of 180 degrees or less.

3. The current sensing assembly of claim 1, wherein the first and second curled portions each have an arc length within a range of 180 degrees and 360 degrees.

4. The current sensing assembly of claim 1, wherein the first and second curled portions are coils each including a plurality of turns.

5. The current sensing assembly of claim 1, wherein the sensor assembly further includes a flux concentrator assembly, the flux concentrator assembly including first and second metallic elements disposed on opposite sides of the first and second curled portions of the conductor, respectively.

6. The current sensing assembly of claim 1, wherein the conductor further includes a horizontal portion; and wherein the first and second curled portions are oriented traverse with respect to the horizontal portion.

7. The current sensing assembly of claim 6, wherein the first curled portion includes a first notch formed therein; wherein the second curled portion includes a second notch formed therein; and wherein the first and second magnetic sensors are respectively disposed in the first and second notches.

8. The current sensing assembly of claim 1, wherein the first and second magnetic sensors are Hall sensors.

\* \* \* \* \*